(12) United States Patent
Takahashi et al.

(10) Patent No.: US 10,090,225 B2
(45) Date of Patent: Oct. 2, 2018

(54) PLACEMENT BASE FOR SEMICONDUCTOR DEVICE AND VEHICLE EQUIPMENT

(71) Applicant: SHINDENGEN ELECTRIC MANUFACTURING CO., LTD., Tokyo (JP)

(72) Inventors: Toyohide Takahashi, Hanno (JP); Takuji Yamashiro, Hanno (JP)

(73) Assignee: Shindengen Electric Manufacturing Co., Ltd., Tokyo (JP)

(*) Notice: Subject to any disclaimer, the term of this patent is extended or adjusted under 35 U.S.C. 154(b) by 0 days.

(21) Appl. No.: 15/545,083

(22) PCT Filed: Jan. 6, 2016

(86) PCT No.: PCT/JP2016/050259
§ 371 (c)(1),
(2) Date: Jul. 20, 2017

(87) PCT Pub. No.: WO2017/119083
PCT Pub. Date: Jul. 13, 2017

(65) Prior Publication Data
US 2018/0012821 A1    Jan. 11, 2018

(51) Int. Cl.
*H01L 23/40* (2006.01)
*B60R 16/03* (2006.01)

(52) U.S. Cl.
CPC ......... *H01L 23/4006* (2013.01); *B60R 16/03* (2013.01); *H01L 2023/4068* (2013.01); *H01L 2023/4087* (2013.01)

(58) Field of Classification Search
CPC ... H01L 23/13; H01L 23/4006; H01L 23/373; H01L 23/49822; H01L 23/49827; H01L 2023/4087; H01L 2023/4068
See application file for complete search history.

(56) References Cited

U.S. PATENT DOCUMENTS 5,497,031 A * 3/1996 Kozono ............. H01L 23/13
                                                 257/693
6,163,065 A    12/2000 Seshan et al.
(Continued)

FOREIGN PATENT DOCUMENTS

JP    2003297990 A    10/2003
JP    2005101259 A     4/2005
(Continued)

OTHER PUBLICATIONS

U.S. Appl. No. 15/545,131, filed Jul. 20, 2017, Takahashi et al.
(Continued)

*Primary Examiner* — Nathan W Ha
(74) *Attorney, Agent, or Firm* — Ladas & Parry, LLP

(57) ABSTRACT

A placement base (100) of a semiconductor device (90) comprises a body (10) on which the semiconductor device (90) is disposed, and a fixing unit (40) for fixing the semiconductor device (90) to the body (10). The body (10) has a supporting unit (12) and a bottom surface (11) placed in an inner periphery of the supporting unit (12) and placed lower than the supporting unit (12). A difference in height ΔH between the supporting unit (12) and the bottom surface (11) is larger than a sum (H1+H2) of a calculated or measured maximum upward warp H1 of the bottom surface (11) and a calculated or measured maximum downward warp H2 of a base of the semiconductor device (90).

11 Claims, 9 Drawing Sheets

(56) References Cited

U.S. PATENT DOCUMENTS

| | | | | |
|---|---|---|---|---|
| 6,261,492 | B1* | 7/2001 | Iovdalsky | H01L 23/13 156/293 |
| 6,396,708 | B1* | 5/2002 | Iguchi | H01L 21/565 174/260 |
| 8,982,577 | B1* | 3/2015 | Fuentes | H01L 23/13 257/787 |
| 2007/0085595 | A1* | 4/2007 | Taki | H01L 27/092 327/534 |
| 2007/0096297 | A1* | 5/2007 | Frey | H01L 23/04 257/706 |
| 2008/0174005 | A1* | 7/2008 | Kubota | H01L 23/13 257/700 |
| 2008/0237852 | A1 | 10/2008 | Yoshida et al. | |
| 2008/0315239 | A1* | 12/2008 | Lin | H01L 21/486 257/99 |
| 2009/0200648 | A1* | 8/2009 | Graves, Jr. | H01L 23/4985 257/659 |
| 2009/0218663 | A1 | 9/2009 | Bauer et al. | |
| 2010/0108512 | A1 | 5/2010 | Hattori | |
| 2013/0020692 | A1* | 1/2013 | Fujisawa | H01L 23/3107 257/676 |
| 2014/0030827 | A1 | 1/2014 | Cadotte et al. | |
| 2014/0217521 | A1* | 8/2014 | Johari-Galle | B81C 1/00134 257/415 |
| 2016/0133776 | A1* | 5/2016 | Kishi | H01L 21/463 257/428 |
| 2016/0172359 | A1* | 6/2016 | Yoon | H01L 27/0886 257/401 |
| 2018/0005911 | A1 | 1/2018 | Takahashi et al. | |

FOREIGN PATENT DOCUMENTS

| | | |
|---|---|---|
| JP | 2009246063 A | 10/2009 |
| JP | 2010010505 A | 1/2010 |
| JP | 2013138113 A | 7/2013 |

OTHER PUBLICATIONS

International Search Report for PCT/JP2016/050259 dated Mar. 22, 2016 and its English translation provided by WIPO.

Written Opinion for PCT/JP2016/050259 dated Mar. 22, 2016, 2016 and its English translation provided by Google Translate.

International Search Report for PCT/JP2016/050257 dated Mar. 15, 2016 and its English translation provided by WIPO.

Written Opinion for PCT/JP2016/050257 dated Mar. 15, 2016, and its English translation provided by Google Translate.

From U.S. Appl. No. 15/545,131 (now U.S. Publication No. 2018-0005911 A1), Non-Final Office Action dated Mar. 7, 2018.

* cited by examiner

US 10,090,225 B2

PLACEMENT BASE FOR SEMICONDUCTOR DEVICE AND VEHICLE EQUIPMENT

CROSS-REFERENCE TO RELATED APPLICATION

This application is the U.S. national phase of PCT Application PCT/JP2016/050259 filed on Jan. 6, 2016, the disclosure of which is incorporated herein by reference in its entirety.

TECHNICAL FIELD

The present invention relates to a placement base for a semiconductor device and a vehicle equipment.

BACKGROUND ART

In the related art, it is known that a semiconductor device covered with a resin mold is to be placed in a metallic case having a radiation unit such as a fin (for example, see JP 2010-10505 A). A placement base is provided inside a case, and a semiconductor device is placed on this placement base. The semiconductor device placed on the placement base is fixed to a fixing unit by a fastener member and the like. In some cases, a warp of the semiconductor device fixed to the fixing unit or a warp of a surface of the placement base leads to disadvantages.

SUMMARY OF INVENTION

Technical Problem

An object of the present invention is to provide a placement base for a semiconductor device and a vehicle equipment capable of resolving disadvantages due to a warp of the semiconductor device fixed to a fixing unit or a warp of a surface of the placement base.

Solution to Problem

A placement base of a semiconductor device according to the present invention comprises:
a body on which the semiconductor device is disposed, and the body having a supporting unit being configured to support at least a part of a periphery of the semiconductor device, and a bottom surface being placed in an inner periphery of the supporting unit and being placed lower than the supporting unit; and
a fixing unit, which is provided to the supporting unit, for fixing the semiconductor device to the body; and
wherein a difference in height $\Delta H$ between the supporting unit and the bottom surface is larger than a sum ($H1+H2$) of a calculated or measured maximum upward warp $H1$ of the bottom surface and a calculated or measured maximum downward warp $H2$ of a base of the semiconductor device.

In the placement base of the semiconductor device according to the present invention,
the semiconductor device may have a substantially quadrilateral shape, when seen from above, and
the supporting unit may be configured to support four sides of the semiconductor device.

In the placement base of the semiconductor device according to the present invention,
the fixing unit may have two fixing holes for inserting and fixing a fastener member being configured to fasten the semiconductor device and
two fixing holes may be provided diagonally.

In the placement base of the semiconductor device according to the present invention,
the supporting unit may have a substantially quadrilateral shape, when seen from above, and has a first supporting unit and a second supporting unit protruding inward, and
the first supporting unit and the second supporting unit may be provided diagonally.

In the placement base of the semiconductor device according to the present invention,
the fixing unit may have two fixing holes for inserting and fixing a fastener member being configured to fasten the semiconductor device and
each of the first supporting unit and the second supporting unit may be provided with the fixing hole.

In the placement base of the semiconductor device according to the present invention,
a radiation material may be placed on the bottom surface.

In the placement base of the semiconductor device according to the present invention,
the radiation material may be a radiation agent having viscosity.

In the placement base of the semiconductor device according to the present invention,
a groove having a depth deeper than a depth of the bottom surface may be provided between the bottom surface and the supporting unit in such a manner that the bottom surface is surrounded intermittently or continuously by the groove.

In the placement base of the semiconductor device according to the present invention,
the bottom surface and the groove may be provided adjacently.

In the placement base of the semiconductor device according to the present invention,
the fixing unit may have at least a fixing hole for inserting and fixing a fastener member being configured to fasten the semiconductor device and
the groove may be provided between the bottom surface and the fixing hole.

A vehicle equipment according to the present invention comprises:
a semiconductor device; and
a placement base having a body on which the semiconductor device is disposed, and a fixing unit for fixing the semiconductor device to the body,
wherein the body has a supporting unit being configured to support at least a part of a periphery of the semiconductor device, and a bottom surface placed in an inner periphery of the supporting unit and placed lower than the supporting unit,
wherein the fixing unit is provided to the supporting unit, and
wherein a difference in height $\Delta H$ between the supporting unit and the bottom surface is larger than a sum ($H1+H2$) of a calculated or measured maximum upward warp $H1$ of the bottom surface and a calculated or measured maximum downward warp $H2$ of a base of the semiconductor device.

Advantageous Effects of Invention

According to the present invention, the difference in height $\Delta H$ between the supporting unit and the bottom surface is larger than the sum ($H1+H2$) of the calculated or measured maximum upward warp $H1$ of the bottom surface and the calculated or measured maximum downward warp $H2$ of the base of the semiconductor device. Therefore, even in a case where the bottom surface warps upward or the base of the semiconductor device warps downward, a contact between the semiconductor device and the bottom surface can be avoided. Thus, it is possible to resolve disadvantages due to the warp of the semiconductor device fixed to the fixing unit or the warp of the surface of the placement base.

BRIEF DESCRIPTION OF DRAWINGS

FIG. 4 is a cross sectional view in which FIG. 3 is divided along a straight line IV-IV illustrated in FIG. 3.

DESCRIPTION OF EMBODIMENTS

Embodiment

<<Configuration>>

Figure 1:
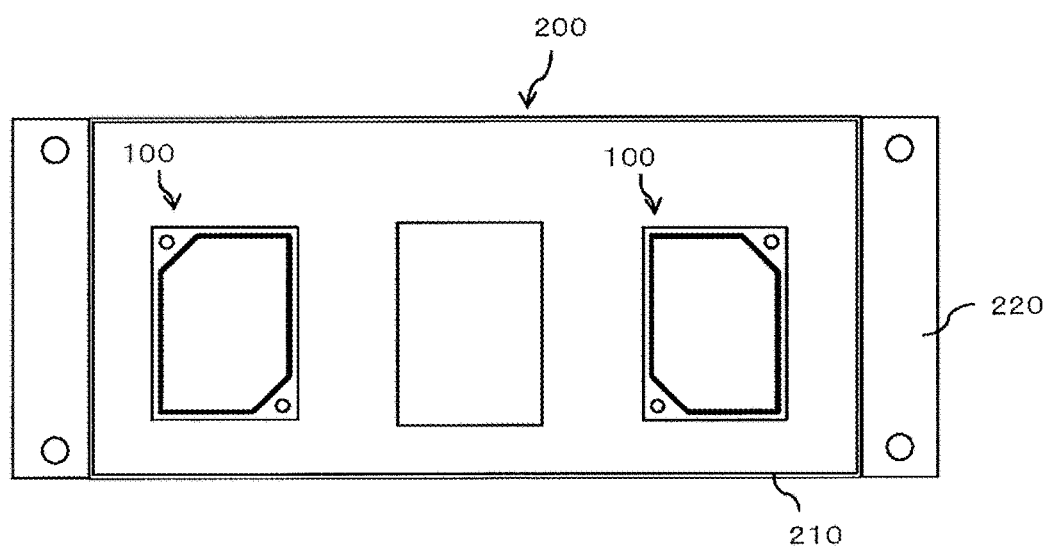
FIG. 1 is a top plane view of vehicle equipment according to an embodiment of the present invention.

A placement base for a semiconductor device according to the present embodiment is disposed in vehicle equipment such as power-supply equipment used in automobiles. As illustrated in FIG. 1, the power-supply equipment includes a case 200 having, for example, a metallic seating 220 for placing switching power-supply equipment and the like, and a metallic cover 210 combined with the seating 220 so as to electromagnetically shield the switching power-supply equipment. FIG. 1 illustrates an inside of the cover 210, but the inside of the cover 210 is actually covered with the cover 210 so that it cannot be seen from an outside. As illustrated in FIG. 1, a placement base 100 is disposed in the case 200.

Figure 2:
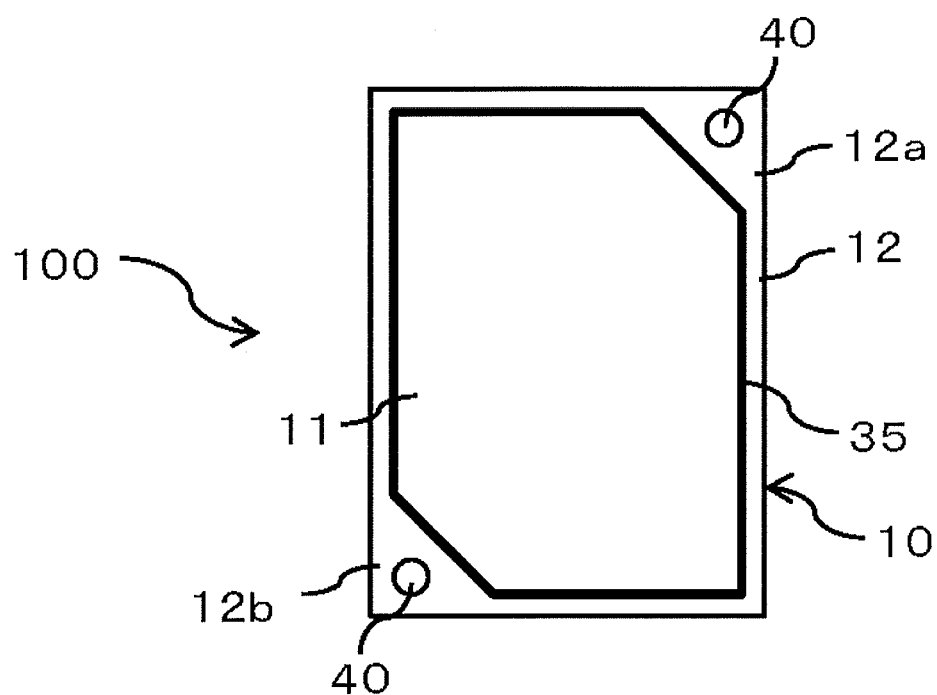
FIG. 2 is a top plane view of a placement base for a semiconductor device according to the embodiment of the present invention.
Figure 4:
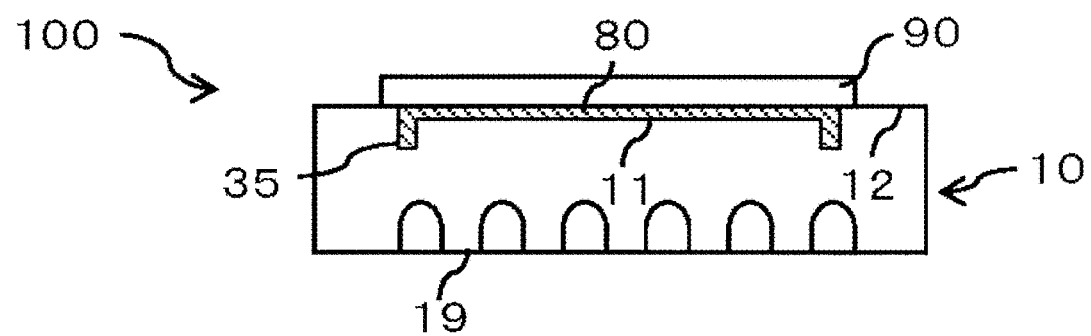

As illustrated in FIG. 2, a placement base 100 for a semiconductor device 90 (see FIG. 4) has a body 10 on which the semiconductor device 90 is placed, and a fixing unit 40 configured to fix the semiconductor device 90 to the body 10. As illustrated in FIG. 4, the body 10 has a supporting unit 12 and a bottom surface 11. The supporting unit 12 is configured to support at least apart of the periphery of the semiconductor device 90. The bottom surface 11 is placed in the inner periphery of the supporting unit 12 and is placed lower than the supporting unit 12. As illustrated in FIG. 2, a fixing unit 40 is provided to the supporting unit 12.

Figure 5:
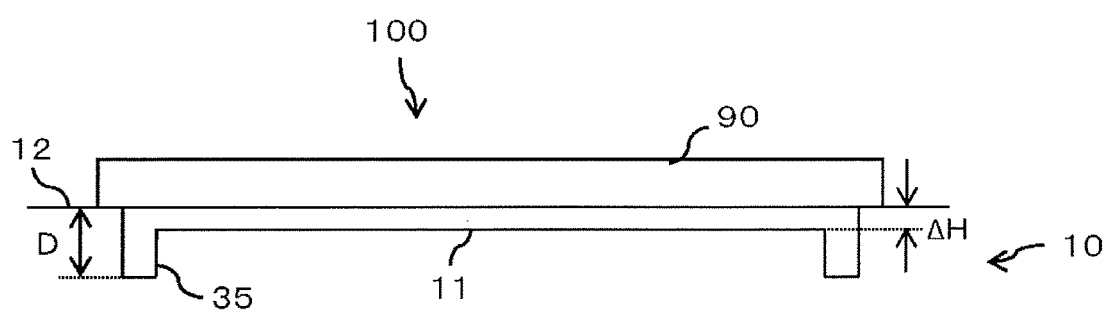
FIG. 5 is a cross sectional view explaining a difference in height ΔH between a supporting unit and a bottom surface, and a depth D of a groove in the embodiment of the present invention.
Figure 6:
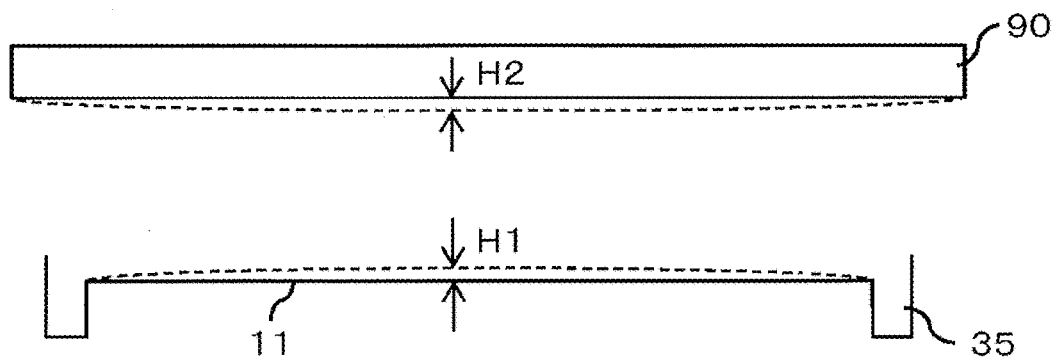
FIG. 6 is across sectional view explaining the calculated or measured maximum upward warp H1 of the bottom surface and the calculated or measured maximum downward warp H2 of a base of the semiconductor device in the embodiment of the present invention.

A difference in height ΔH between the supporting unit 12 and the bottom surface 11 (see FIG. 5) is larger than a sum (H1 +H2) of the calculated or measured maximum upward warp H1 of the bottom surface 11 (see FIG. 6) and the calculated or measured maximum downward warp H2 of a base of the semiconductor device (see FIG. 6). For example, the difference in height ΔH between the supporting unit 12 and the bottom surface 11 may be set to a range from 0.15 mm to 0.30 mm, more preferably from 0.15 mm to 0.20 mm, still more preferably 0.15 mm to 0.17 mm. To enhance radiatability, the placement base 100 may be formed of a metallic material.

Setting the difference in height ΔH between the supporting unit 12 and the bottom surface 11 to 0.15 mm or more, ΔH can be made larger than H1+H2.

However, an overly large difference in height ΔH between the supporting unit 12 and the bottom surface 11 may cause inefficiency in conducting the heat generated in the semiconductor device 90 to the placement base 100, even with placement of a radiation sheet 81 to be mentioned later (see FIG. 7) or application of a radiation agent 80 (see FIG. 4) such as radiation grease having viscosity. Therefore, the maximum of ΔH can be set to 0.30 mm, for example. From a perspective of efficiently conducting the heat generated in the semiconductor device 90 to the placement base 100, the maximum of ΔH is preferably set to 0.20 mm, and more preferably set to 0.17 mm.

As illustrated in FIG. 2, the body 10 herein seen from above may have a substantially quadrilateral shape. Herein, the term "above" represents the normal direction side of a placement surface on which the semiconductor device 90 is placed. In regard to the term "substantially quadrilateral shape" herein, satisfactory is a shape with two pairs of sides opposing each other. For example, an aspect of a shape with rounded corners is also included in the term.

In a case where the semiconductor device 90 has a substantially quadrilateral shape, the supporting unit 12 may be configured to support at least two opposing sides of the semiconductor device 90. Furthermore, the supporting unit 12 may be configured to support four sides of the semiconductor device 90. Herein described is an aspect in which the supporting unit 12 supports the four sides of the semiconductor device 90.

Figure 3:
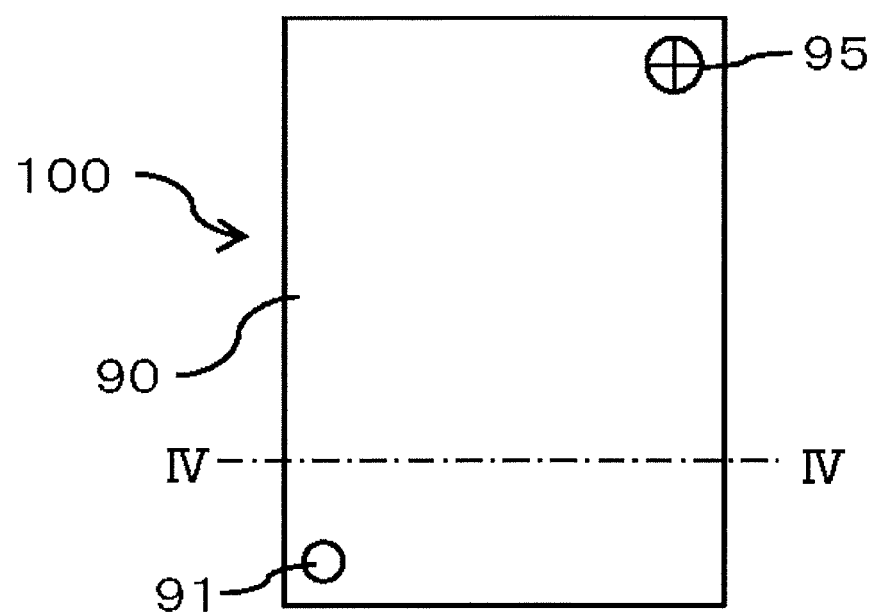
FIG. 3 is a top plane view illustrating an aspect in which a semiconductor device is placed on a placement base according to an embodiment of the present invention.
Figure 8:
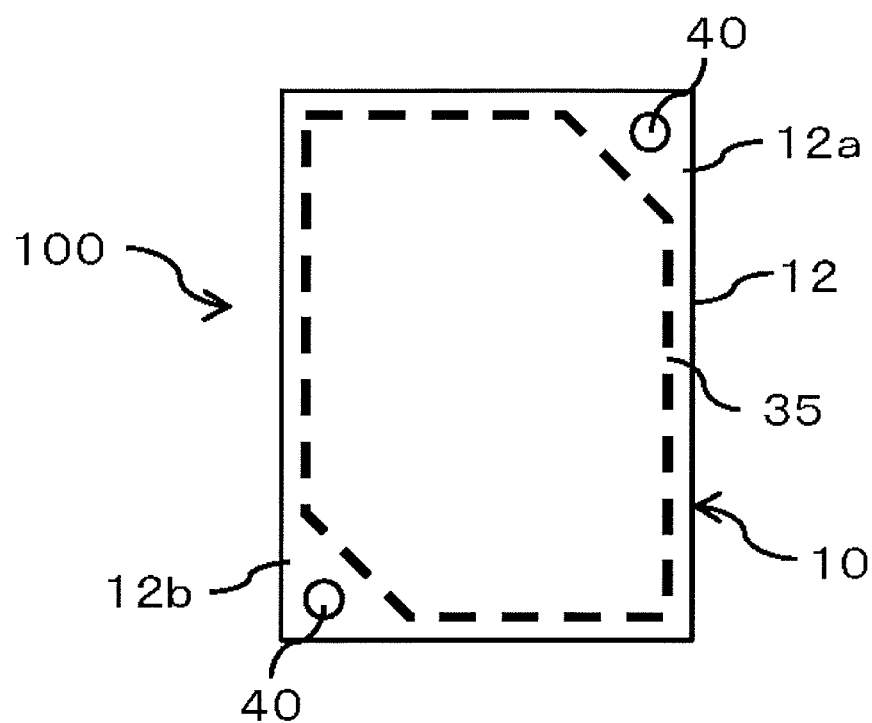
FIG. 8 is a top plane view illustrating a placement base of a semiconductor device according to a second modification of the embodiment of the present invention.

The fixing unit 40 illustrated in FIG. 2 and the like may be, for example, a fixing hole 40 such as a screw hole for inserting and fixing a fastener member 95 (see FIG. 3) such as a screw configured to fasten the semiconductor device 90. At least two fixing holes 40 may be provided. The two fixing holes 40 may be provided diagonally as illustrated in FIGS. 2 and 8. In such an aspect, as illustrated in FIG. 3, the semiconductor device 90 may have a through-hole 91 into which the fastener member 95 is inserted.

Figure 9:
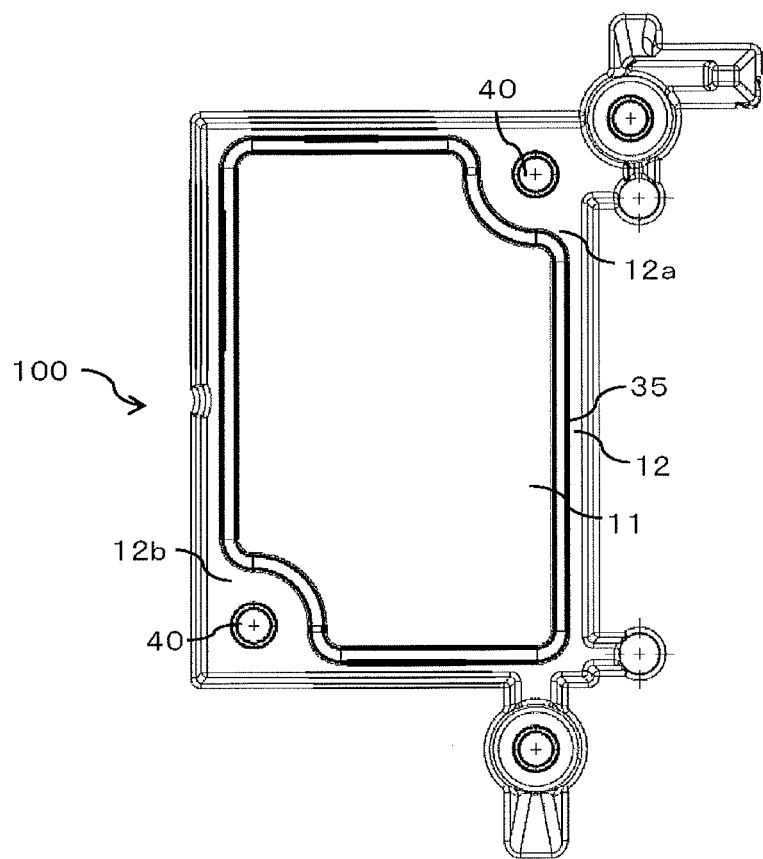
FIG. 9 is a top plane view illustrating a placement base of a semiconductor device according to a third modification of the embodiment of the present invention.

As illustrated in FIG. 2, the substantially quadrilateral shaped supporting unit 12 may have a first supporting unit 12a and a second supporting unit 12b protruding inward. The first supporting unit 12a and a second supporting unit 12b may be provided diagonally (in corners). Each of the first supporting unit 12a and the second supporting unit 12b may be provided with the fixing hole 40. As illustrated in FIG. 9, the first supporting unit 12a and the second supporting unit 12b may have a semicircular shape and may protrude inward.

In a case of employing the radiation agent 80, a groove 35 having a depth deeper than that of the bottom surface 11 may be provided between the bottom surface 11 and the supporting unit 12 in such a manner that the bottom surface 11 is surrounded by the groove 35 intermittently or continuously. FIG. 2 illustrates an aspect in which the groove 35 is provided, surrounding the bottom surface 11 continuously.

Figure 7:
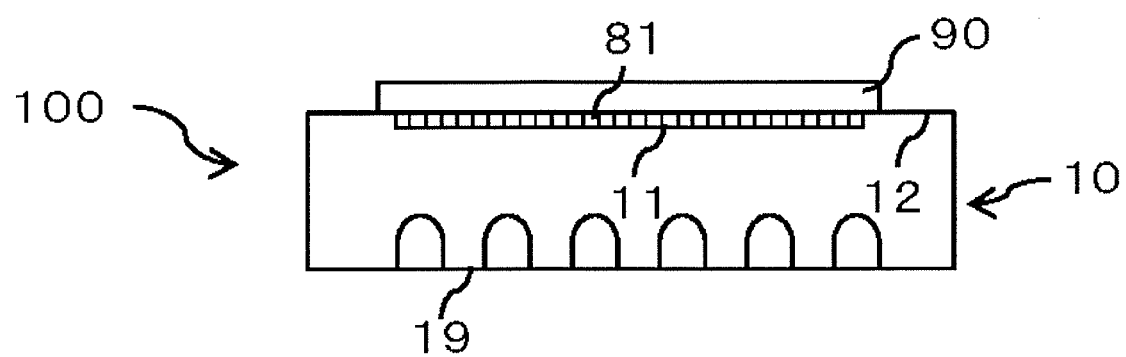
FIG. 7 is a cross sectional view corresponding to FIG. 4, illustrating an aspect in which a semiconductor device is placed on a placement base according to a first modification of the embodiment of the present invention.

FIG. 8 illustrates an aspect in which the groove 35 is provided, surrounding the bottom surface 11 intermittently. A radiation material such as the radiation agent 80 and the radiation sheet 81 may be placed on the bottom surface 11. FIG. 4 illustrates an aspect in which the radiation agent 80 is placed on the bottom surface 11. FIG. 7 illustrates an aspect in which the radiation sheet 81 is placed on the bottom surface 11.

The supporting unit 12 may be configured to support the semiconductor device 90 only at the periphery. The supporting unit 12 for supporting the semiconductor device 90 may not be provided to the inner side of the groove 35. Furthermore, the bottom surface 11 and the groove 35 may be provided adjacently (consecutively) (see FIG. 4). Furthermore, the depth D of the groove 35 (see FIG. 5) may be made deeper than the depth $\Delta H$ of the bottom surface 11 (=the difference in height between the supporting unit 12 and the bottom surface 11). In such a case, the depth D of the groove 35 may be made ten or less times as large as the depth $\Delta H$ of the bottom surface 11 or seven or less times as large as the depth $\Delta H$ of the bottom surface 11.

As illustrated in FIG. 8, a fin 19 may be provided to a back surface of the body 10. According to such an aspect, it is possible to enhance the radiatability.

<<Effects>>

Next, effects, which are not described yet, achieved by the present embodiment with the above-described configuration will be described.

According to the present embodiment, the difference in height $\Delta H$ between the supporting unit 12 and the bottom surface 11 is larger than the sum (H1+H2) of the calculated or measured maximum upward warp H1 of the bottom surface 11 and the calculated or measured maximum downward warp H2 of the base of the semiconductor device 90 (see FIGS. 5 and 6). Therefore, even in a case where the bottom surface 11 warps upward or the base of the semiconductor device 90 warps downward, a contact between the semiconductor device 90 and the bottom surface 11 can be avoided. Thus, it is possible to resolve disadvantages due to the warp of the semiconductor device 90 fixed to the fixing unit 40 or the warp of the surface of the placement base 100. For example, the difference in height $\Delta H$ between the supporting unit 12 and the bottom surface 11 may be set to 0.15 mm or more.

By setting $\Delta H$ to, for example, 0.30 mm or less, the heat generated in the semiconductor device 90 can be conducted to the placement base 100 efficiently with the radiation sheet 81 (see FIG. 7) and the radiation agent 80 (see FIG. 4). By setting $\Delta H$ to, for example, 0.20 mm or less, the heat generated in the semiconductor device 90 can be conducted to the placement base 100 more efficiently with the radiation sheet 81 or the radiation agent 80. By setting $\Delta H$ to, for example, 0.17 mm or less, the heat generated in the semiconductor device 90 can be conducted to the placement base 100 much more efficiently with the radiation sheet 81 or the radiation agent 80.

In a case of employing an aspect in which the semiconductor device 90 has a substantially quadrilateral shape and the supporting unit 12 is configured to support two opposing sides of the semiconductor device 90, the supporting unit 12 can support the semiconductor device 90 in a well-balanced manner. Therefore, it is possible to set $\Delta H$ to a value closer to the value set in advance and it is possible to resolve the disadvantages due to the warp of the semiconductor device 90 fixed to the fixing unit 40 or the warp of the surface of the placement base 100. In a case of employing the radiation agent 80 as the radiation material, the radiation agent 80 can be made to have a more uniform thickness so that the heat generated in the semiconductor device 90 can be conducted to the placement base 100 efficiently.

In a case where the semiconductor device 90 has a substantially rectangular shape, by employing an aspect in which the supporting unit 12 is configured to support the opposing long sides of the semiconductor device 90, the supporting unit 12 can support the semiconductor device 90 in a more well-balanced manner. In regard to the term "substantially rectangular shape" herein, satisfactory is a shape with two pairs of opposing sides including short sides and long sides. For example, an aspect of a shape with rounded corners is also included in the term. It should be noted that the short sides may not necessarily have the same length, and one of a pair of short sides may be longer than the other. Furthermore, the long sides may not necessarily have the same length, and one of a pair of long sides may be longer than the other. However, note that the longer side of the short sides is to be shorter than the shorter side of the long sides.

In a case where the semiconductor device 90 has a substantially quadrilateral shape, by employing an aspect in which the supporting unit 12 is configured to support the four sides of the semiconductor device 90, the supporting unit 12 can support the semiconductor device 90 in a much more well-balanced manner. Therefore, it is possible to set $\Delta H$ to a value much closer to the value set in advance and it is possible to resolve more reliably the disadvantages due to the warp of the semiconductor device 90 fixed to the fixing unit 40 or the warp of the surface of the placement base 100. In a case of employing the radiation agent 80 as the radiation material, the radiation agent 80 can be made to have a more uniform thickness, and the heat generated in the semiconductor device 90 can be conducted to the placement base 100 more efficiently.

As illustrated in FIG. 2, in a case of employing an aspect in which two fixing holes 40 are provided diagonally, it is excellent in that the semiconductor device 90 can be fixed with respect to the placement base 100 in a well-balanced manner. By fixing the semiconductor device 90 on the placement base 100 in such a well-balanced manner, it is possible to make differences in height between the supporting unit 12 and the bottom surface 11 more uniformly in the entire surface direction. Thus, the heat generated in the semiconductor device 90 can be conducted to the placement base 100 more efficiently. In a case of employing the radiation agent 80 as the radiation material, the radiation agent 80 can be made to have a more uniform thickness so that it is favorable in that the heat generated in the semiconductor device 90 can be conducted to the placement base 100 more efficiently.

As illustrated in FIGS. 2 and 8, in a case where the substantially quadrilateral shaped supporting unit 12 has the first supporting unit 12a and the second supporting unit 12b protruding inward and where the first supporting unit 12a and the second supporting unit 12b are provided diagonally, the semiconductor device 90 can be firmly supported by the first supporting unit 12a and the second supporting unit 12b in a diagonal line having a long length. Provision of such a first supporting unit 12a and a second supporting unit 12b reduces an area for supporting the semiconductor device 90 among other areas in the supporting unit 12. Thus, it is possible to reduce possibilities that the placement base 100 and the bottom surface interferes with each other due to the warp of the semiconductor device 90. Since the length is long in the diagonal line, it is possible to widely provide the bottom surface 11 with a height lower than that of the supporting unit 12 even though the area for supporting the semiconductor device 90 is made large due to the first supporting unit 12a and the second supporting unit 12b provided to the corners. Therefore, it is possible to resolve more reliably the disadvantages due to the warp of the semiconductor device 90 fixed to the fixing unit 40 or the warp of the surface of the placement base 100.

In a case of employing an aspect in which semiconductor device 90 is fixed, for example, by inserting the fastener member 95 such as a screw into the through-hole 91 of the semiconductor device 90 and into the fixing hole 40 with thread cutting such as a screw hole (see FIG. 3), clamping by the fastener member 95 easily leads to the warp of the semiconductor device 90. In other words, the semiconductor device 90 is tend to warp due to the clamping by the fastener member 95, which is caused by no "allowance" and the like between the semiconductor device 90 and the placement base 100. Therefore, in such an aspect in which ΔH becomes larger than H1+H2 as in the present embodiment, it is possible to exert a much higher effect.

In a case of employing an aspect in which a radiation material such as the radiation agent 80 and the radiation sheet 81 is placed on the bottom surface 11 (see FIGS. 4 and 7), it is possible to fill a gap between the bottom surface 11 and the base of the semiconductor device 90 with the highly-radiating material and to conduct the heat generated in the semiconductor device 90 to the placement base 100 more efficiently. From a perspective of spreading the radiation material evenly over the bottom surface 11 to achieve a uniform radiation effect, it is preferable to apply the radiation agent 80 having viscosity such as the radiation grease rather than the radiation sheet 81.

By employing such a radiation agent 80, the groove 35 may be provided between the bottom surface 11 and the supporting unit 12 in such a manner that the bottom surface 11 is surrounded by the groove 35 continuously (see FIG. 2) or intermittently (see FIG. 8). By employing such a groove 35, it is possible to prevent the radiation agent 80 spreading out between the back surface of the semiconductor device 90 and the bottom surface 11 from leaking to the outside. As illustrated in FIG. 2, according to an aspect in which the groove 35 with the height lower (depth deeper) than that of the bottom surface 11 are continuously provided, it is excellent in that the radiation agent 80 can be prevented more reliably from leaking to the outside.

The depth D of the groove 35 may be made larger than the difference in height ΔH between the supporting unit 12 and the bottom surface 11. For example, the depth D of the groove 35 may be four to ten times as large as ΔH, if more limited, five to seven times as large as ΔH. Making the depth D of the groove 35 sufficiently deep, the radiation agent 80 can be prevented from leaking to the outside.

In a case of employing an aspect in which the bottom surface 11 and the groove 35 is provided adjacently (see FIG. 4), it is possible to directly pour the radiation agent 80 spreading out over the bottom surface 11 into the groove 35. By making the depth D of the groove 35 ten or less times as large as ΔH, it is possible to prevent formation of a gap between the radiation agent 80 poured into the groove 35 and the base of the semiconductor device 90. By making the depth D of the groove 35 seven or less times as large as ΔH, it is possible to prevent more reliably the formation of the gap between the radiation agent 80 poured into the groove 35 and the base of the semiconductor device 90. Accordingly, the heat generated in the semiconductor device 90 can be conducted to the placement base 100 more efficiently by involving the radiation agent 80 poured into the groove 35.

By adjacently providing the groove 35 deeper than the bottom surface 11 around the bottom surface 11, it is favorable in that the bottom surface 11 (a substantially central part thereof) can be prevented from warping upward. Furthermore, by continuously providing the groove 35 deeper than the bottom surface 11 around the bottom surface 11, it is favorable in that the bottom surface 11 (the substantially central part thereof) can be prevented more reliably from warping upward.

In a case where the groove 35 is provided between the bottom surface 11 and the fixing hole 40, it is possible to prevent the fixing hole 40 from being filled with the radiation agent 80 spreading out between the back surface of the semiconductor device 90 and the bottom surface 11.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST

10 Body
11 Bottom surface
12 Supporting unit
12a First supporting unit
12b Second supporting unit
20 Protrusion
30 Detective groove
35 Body-side groove
40 Fixing unit
80 Radiation agent
90 Semiconductor device
95 Fastener member
100 Placement base
200 Case

What is claimed is:

1. A placement base of a semiconductor device comprising:
   a body on which the semiconductor device is disposed, and the body having a supporting unit, on which a back face of the semiconductor device is placed, being configured to support at least a part of a periphery of the back face of the semiconductor device, and a bottom surface being placed in an inner periphery of the supporting unit and being placed lower than the supporting unit; and
   a fixing unit, which is provided to the supporting unit, for fixing the semiconductor device to the body; and
   wherein a difference in height ΔH between the supporting unit and the bottom surface is larger than a sum (H1+H2) of a calculated or measured maximum upward warp H1 of the bottom surface and a calculated or measured maximum downward warp H2 of a base of the semiconductor device.

2. The placement base of the semiconductor device according to claim 1,
   wherein the semiconductor device has a substantially quadrilateral shape, when seen from above, and
   wherein the supporting unit is configured to support four sides of the semiconductor device.

3. The placement base of the semiconductor device according to claim 1,
   wherein the fixing unit has two fixing holes for inserting and fixing a fastener member being configured to fasten the semiconductor device and
   wherein two fixing holes are provided diagonally.

4. The placement base of the semiconductor device according to claim 1,
   wherein the supporting unit has a substantially quadrilateral shape, when seen from above, and has a first supporting unit and a second supporting unit protruding inward, and
   wherein the first supporting unit and the second supporting unit are provided diagonally.

5. The placement base of the semiconductor device according to claim 4,
   wherein the fixing unit has two fixing holes for inserting and fixing a fastener member being configured to fasten the semiconductor device and
   wherein each of the first supporting unit and the second supporting unit is provided with the fixing hole.

6. The placement base of the semiconductor device according to claim 1,
   wherein a radiation material is placed on the bottom surface.

7. The placement base of the semiconductor device according to claim 6,
   wherein the radiation material is a radiation agent having viscosity.

8. The placement base of the semiconductor device according to claim 7,
   wherein a groove having a depth deeper than a depth of the bottom surface is provided between the bottom surface and the supporting unit in such a manner that the bottom surface is surrounded intermittently or continuously by the groove.

9. The placement base of the semiconductor device according to claim 8,
   wherein the bottom surface and the groove are provided adjacently.

10. The placement base of the semiconductor device according to claim 8,
    wherein the fixing unit has at least a fixing hole for inserting and fixing a fastener member being configured to fasten the semiconductor device and
    wherein the groove is provided between the bottom surface and the fixing hole.

11. A vehicle equipment comprising:
    a semiconductor device; and
    a placement base having a body on which the semiconductor device is disposed, and a fixing unit for fixing the semiconductor device to the body,
    wherein the body has a supporting unit, on which a back face of the semiconductor device is placed, being configured to support at least a part of a periphery of the back face of the semiconductor device, and a bottom surface placed in an inner periphery of the supporting unit and placed lower than the supporting unit,
    wherein the fixing unit is provided to the supporting unit, and
    wherein a difference in height $\Delta H$ between the supporting unit and the bottom surface is larger than a sum (H1+H2) of a calculated or measured maximum upward warp H1 of the bottom surface and a calculated or measured maximum downward warp H2 of a base of the semiconductor device.

* * * * *